United States Patent
Hino et al.

(10) Patent No.: US 7,026,183 B2
(45) Date of Patent: Apr. 11, 2006

(54) LONG-WAVELENGTH SEMICONDUCTOR LIGHT EMITTING DEVICE AND ITS MANUFACTURING METHOD

(75) Inventors: Tomonori Hino, Kanagawa (JP); Hironobu Narui, Kanagawa (JP); Jugo Mitomo, Kanagawa (JP)

(73) Assignee: Sony Corporation, Tokyo (JP)

( * ) Notice: Subject to any disclaimer, the term of this patent is extended or adjusted under 35 U.S.C. 154(b) by 39 days.

(21) Appl. No.: 10/917,900

(22) Filed: Aug. 13, 2004

(65) Prior Publication Data
US 2005/0040408 A1 Feb. 24, 2005

(30) Foreign Application Priority Data
Aug. 19, 2003 (JP) .......................... P2003-295091

(51) Int. Cl.
*H01L 21/00* (2006.01)
(52) U.S. Cl. .......................... 438/47; 438/46; 438/935
(58) Field of Classification Search .................. None
See application file for complete search history.

(56) References Cited

U.S. PATENT DOCUMENTS

| | | | |
|---|---|---|---|
| 6,674,785 B1 * | 1/2004 | Sato et al. ................. | 372/96 |
| 6,765,232 B1 * | 7/2004 | Kaminishi et al. ......... | 257/79 |
| 6,803,604 B1 * | 10/2004 | Takahashi et al. ......... | 257/80 |

2003/0181024 A1 9/2003 Takeuchi et al.

FOREIGN PATENT DOCUMENTS

JP  10-145003  5/1998

OTHER PUBLICATIONS

T. Takeuchi, et al., "MOCVD growth of InGaAsN and 1-3-μm lasers", Photonics West 2003 Session No. 4995-08, Abstract.
James S. Harris, Jr., "GaInNAsSb long-wavelength lasers on GaAs", Solid State and Photonics Lab, Stanford University, CIS-X 328, Proceedings of SPIE vol. 4995 (2003) SPIE-0277-786X/03, Session 4995-10.
Ralph Johnson, et al., "Long wavelength VCSELs at Honeywell", Proceedings of SPIE vol. 4994 (2003), SPIE-0227-786X/03, Session 4995-33.

* cited by examiner

*Primary Examiner*—Ngân V. Ngô
(74) *Attorney, Agent, or Firm*—Sonnenschein, Nath & Rosenthal LLP

(57) ABSTRACT

For manufacturing a long-wavelength semiconductor light emitting device having excellent characteristics and long lifetime, a highly reactive gas is supplied together with a source material of As while the supply of a source material of a group III element is interrupted during the growth of a layer (GaAs optical guide layer) anteriorly adjacent to the active layer or immediately before the growth of the active layer. The highly reactive gas may be di-methyl hydrazine or ammonia ($NH_3$), for example.

5 Claims, 6 Drawing Sheets

LONG-WAVELENGTH SEMICONDUCTOR LIGHT EMITTING DEVICE AND ITS MANUFACTURING METHOD

BACKGROUND OF THE INVENTION

1. Field of the Invention

The present invention relates to a long-wavelength semiconductor light emitting device and its manufacturing method, and more particularly to those using GaInNAs-system semiconductors (simply called GaInNAs semiconductors hereinbelow) as materials of the active layer.

2. Description of the Related Art

Long-wavelength semiconductor light emitting devices using GaInNAs semiconductors as materials of the active layers can cover the emission wavelength region from 1.3 to 1.55 µm depending upon the mixing ratio of In and N in GaInNAs, and can be realized by using inexpensive GaAs substrates. Furthermore, these GaInNAs long-wavelength semiconductor light emitting devices permit large diffraction index differences An among layers of materials in lattice matching with substrates. Therefore, these materials make it possible to fabricate excellent distributed Bragg reflectors (DBR), and there has been a movement toward their applications to vertical cavity surface emitting lasers (VCSEL), which are hopeful as a form of optical communication lasers. Therefore, these GaInNAs long-wavelength semiconductor light emitting devices have been remarked for years as the next-generation optical communication semiconductor lasers substituting expensive GaInAsP long-wavelength semiconductor light emitting devices using InP substrates.

When a GaInNAs well layer is formed on an AlGaAs layer by metal organic chemical vapor deposition (MOCVD), the GaInNAs well layer catches Al therein by approximately 0.1% even though tri-methyl aluminum (TMA) is not supplied intentionally during its growth, and this aluminum adversely affects the static characteristics of the GaInNAs semiconductor laser. However, it has been reported that a GaInNAs well layer grown on a GaAs layer will not take Al therein (Photonics West 2003 Session No. 4995-08, herein below referred to as Non-patent Literature 1).

Additionally, there are some other proposals about techniques for manufacturing GaInNAs semiconductor lasers by the use of GaNAs layers as barrier layers of active layers (Japanese Patent Laid-open Publication No. JP-H10-145003-A, referred to as Patent Literature 1; Photonics West 2003 Session No. 4994-18, referred to as Non-patent Literature 2; and Photonics West 2003 Session No. 4994-33, referred to as Non-patent Literature 3).

In the above-introduced GaInNAs long-wavelength semiconductor light emitting devices, an AlGaAs layer in lattice matching with GaAs as its substrate is used as a clad layer. However, during the growth of the AlGaAs layer, tri-methyl aluminum or tri-ethyl aluminum (TEA) used as the source material of Al reacts in vapor phase with di-methyl hydrazine (DMHy) used as the source material of N, and produces reaction products (adducts). The Inventors confirmed by observation using a transmission electron microscope that the products of the vapor phase reaction produced during growth of the AlGaAs layer as a barrier layer of the active layer, for example, degrades the sharpness of the interface with the active layer.

Furthermore, the Inventors prepared a trial GaInNAs long-wavelength semiconductor laser and analyzed it by secondary ion mass spectroscopy (SIMS). As a result, they found a large amount of Al in portions of well layers and barrier layers even when any Al source material is not supplied intentionally into the reaction vessel during the growth of peripheral layers of the active layer (well layers, barrier layers and guide layers). Although the Inventors are not sure how the layers catch Al, they can presume that exposure of the substrate to an atmosphere containing a mixture of Al or its source material and an N source material invites the intrusion of Al and will cause a quality degradation of the active layer. This is a serious problem. A report of a research institute (Agilent Technologies) also remarks this issue of Al as inviting serious adverse influences to the static characteristics of GaInNAs semiconductor lasers (Non-patent Literature 1).

To overcome this problem, AGILENT proposes to first grow an n-type clad layer; then remove the substrate out of the reaction vessel of the growth apparatus; next clean the interior of the reaction vessel; and thereafter resume the growth of the active layer (Non-patent Literature 1). Taking account of defects departing from the interface of the layer grown after interruption of the growth, which will adversely affect the reliability, as well as an increase of the manufacturing cost by the need of the double-step growth, a new technique is invoked, which can prevent intake of the Al impurity in one step of crystal growth. In addition, for realization of practical GaInNAs long-wavelength semiconductor lasers, it remains unclear whether or not the Al impurity has to be removed completely from the active layer.

OBJECTS AND SUMMARY OF THE INVENTION

It is therefore an object of the present invention to provide a long-wavelength semiconductor light emitting device having excellent characteristics and a long lifetime, as well as its manufacturing method, with which an active layer of a good quality can be obtained because of a sufficiently low concentration of Al impurity in the active layer.

The Inventors made vigorous researches to accomplish the above-mentioned object as abstracted below.

As a technique for solving the problems in the prior techniques, the Inventors have found that the concentration of Al impurity contained in the active layer can be reduced to $1 \times 10^{19}$ cm$^{-3}$ if the supply of the source material of a group III element is interrupted during the growth of a layer (such as an optical guide layer) anteriorly adjacent to the active layer of a GaInNAs long-wavelength semiconductor light emitting device or immediately before the start of growth of the active layer, and a highly reactive gas such as DMHy is supplied together with a source material of As used as a group V element. The Inventors also found that the Al impurity concentration reduced to this level ensures characteristics acceptable for practical use. This technique is completely different from techniques of Patent Literature 1 and Non-patent Literatures 2 and 3.

FIG. 1 shows correlation between the peak concentration of Al impurity in the GaInNAs active layer obtained by bar check and the slope efficiency. FIG. 2 shows correlation between the characteristic temperature measured after assembly of the laser and the peak concentration of Al impurity in the GaInNAs active layer. FIG. 3 shows correlation the emission intensity (peak intensity) from the GaInNAs active layer obtained by photoluminescence (PL) measurement and the peak concentration of Al impurity in the GaInNAs active layer. Note that the reflectance of the front edge of the laser is 50% and the reflectance of the rear edge is 95%. It is appreciated from FIGS. 1, 2 and 3 that, under the Al impurity concentration equal to or lower than $1 \times 10^{19}$ cm$^{-3}$, the slope efficiency is approximately equal to or higher than 0.25, and the characteristic temperature is equal to or higher than 150K, which are practically acceptable levels, and that the emission intensity is enhanced as well. It is also appreciated that, under the Al impurity concentration lower than or equal to 5×10$^{18}$ cm$^{-3}$, laser characteristics of a significantly high quality, with the slope efficiency equal to or higher than 0.4 and the characteristic temperature exceeding 200K, can be obtained.

The present invention has been made based on these researches.

According to the first aspect of the invention, there is provided a long-wavelength semiconductor light emitting device using Ga$_{1-x}$In$_x$N$_y$As$_{1-y-z}$Sb$_z$ (0<x<1, 0<y<1, 0≦z<1) as an active layer thereof, characterized in that the peak concentration of Al impurity contained in the active layer is lower than or equal to 1×10$^{19}$ cm$^{-3}$.

The peak concentration of Al impurity contained in the active layer is preferably lower than or equal to 5×10$^{18}$ cm$^{-3}$. The active layer typically has a single-quantum-well structure or multi-quantum-well structure in which the well layer or layers are made of Ga$_{1-x}$In$_x$N$_y$As$_{1-y-z}$Sb$_z$, and the peak concentration of Al impurity contained in the well layer or layers is lower than or equal to 1×10$_{19}$ cm$_{-3}$, or more preferably lower than or equal to 5×10$_{18}$ cm$_{-3}$.

According to the second aspect of the invention, there is provided a manufacturing method of a long-wavelength semiconductor light emitting device using Ga$_{1-x}$In$_x$N$_y$As$_{1-y-z}$Sb$_z$ (0<x<1, 0<y<1, 0≦z<1) as an active layer thereof and having a peak concentration of Al impurity contained in the active layer, which is controlled to be lower than or equal to 1×10$^{19}$ cm$^{-3}$, comprising:

supplying a highly reactive gas together with a source material of As while the supply of a source material of a group III element is interrupted during the growth of a layer anteriorly adjacent to the active layer or immediately before the growth of the active layer.

As the highly reactive gas, here are usable, for example, nitrogen (N) radicals produced by plasma decomposition of di-methyl hydrazine (DMHy), ammonia (NH$_3$) or nitrogen (N$_2$). As the source material of As, arsine (AsH$_3$) or tertiary-butyl arsine (TBAS), for example, may be used. The layer immediately preceding the active layer is typically an optical guide layer. Conditions for the supply of the highly reactive gas may depend on the form of the reaction furnace used. In general, however, if the flow rate is too low, the supply of the gas is not so effective. If the flow rate is too high, it increases the possibility of undesirably etching the growth layer on the substrate. If the flow time is too short, the supply of the gas is not so effective. If the flow time is too long, it increases the possibility of undesirably etching the growth layer on the substrate. Considering these factors, the gas is preferably supplied at a flow rate from 200 sccm to 4 slm for a length of time from one minute to 30 minutes.

Not only during the growth of the layer anteriorly adjacent to the active layer or immediately before the start of growth of the active layer but also during the growth of the layer posteriorly adjacent to the active layer or immediately after the growth of the active layer, the supply of the source material of the group III element may be interrupted and the highly reactive gas may be supplied together with the source material of the group V element. This is effective for cleaning the surface of the reaction chamber or reaction vessel.

According to the first aspect of the invention, having the above summarized configuration, the peak concentration of Al impurity contained in the active layer, which is equal to or lower than 1×10$^{19}$ cm$^{-3}$, contributes to prevention of the problem caused by the existence of Al impurity in the active layer, especially in its well layers.

According to the second aspect of the invention, since the highly reactive gas is supplied together with the source material of As during the growth of the layer immediately preceding the active layer or immediately before the growth of the active layer while the supply of the source material of the group III element is interrupted, etching function of the highly reactive gas serves to remove the group III element or products of vapor phase reaction including the group III element, which adhere on the surface of the reaction chamber or reaction vessel of the growth apparatus during the preceding growth. In addition, since the supply of the source material of the group III element is interrupted in this process, the group III element or reaction products containing the group III element do not adhere additionally.

According to the present invention, it is possible to obtain a long-wavelength semiconductor light emitting device enhanced in emission intensity and slope efficiency, and having a high characteristic temperature and a long lifetime.

The above and other objects and features of the present invention will become apparent from the following detailed description and the appended claims with reference to the accompanying drawings.

DETAILED DESCRIPTION OF THE PREFERRED EMBODIMENTS

Figure 1:
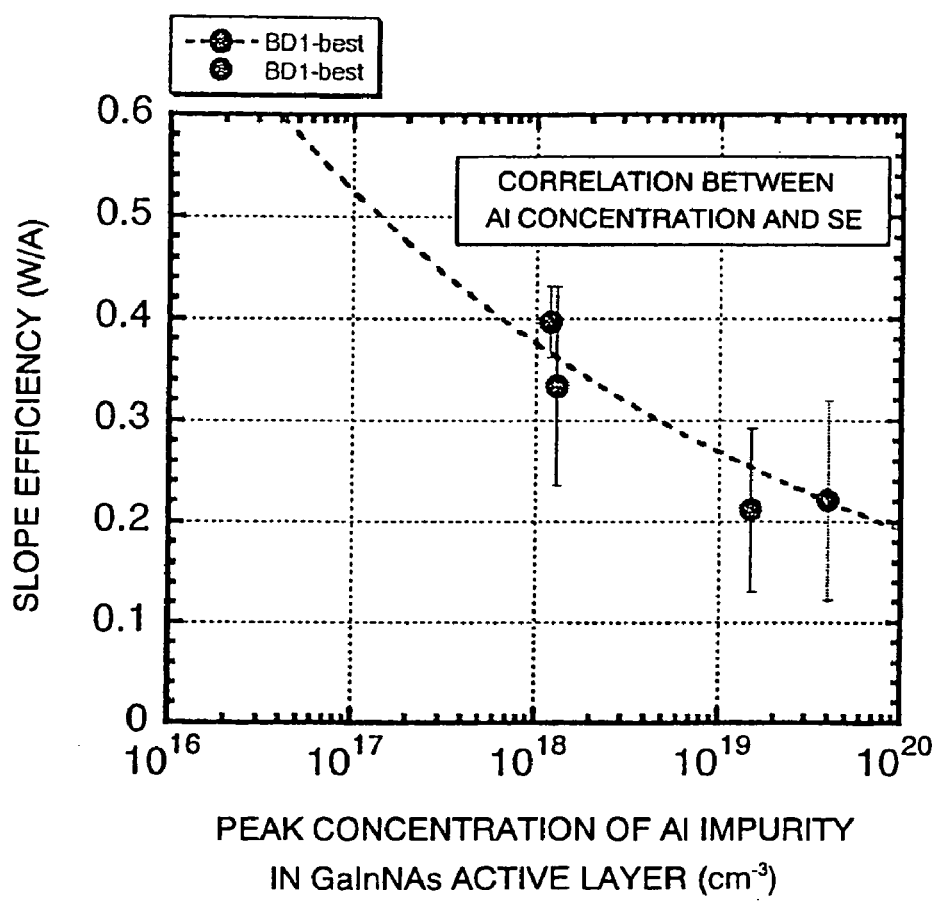
FIG. 1 is a schematic diagram showing correlation between the peak concentration of Al impurity in a GaInNAs active layer and the slope efficiency.
Figure 2:
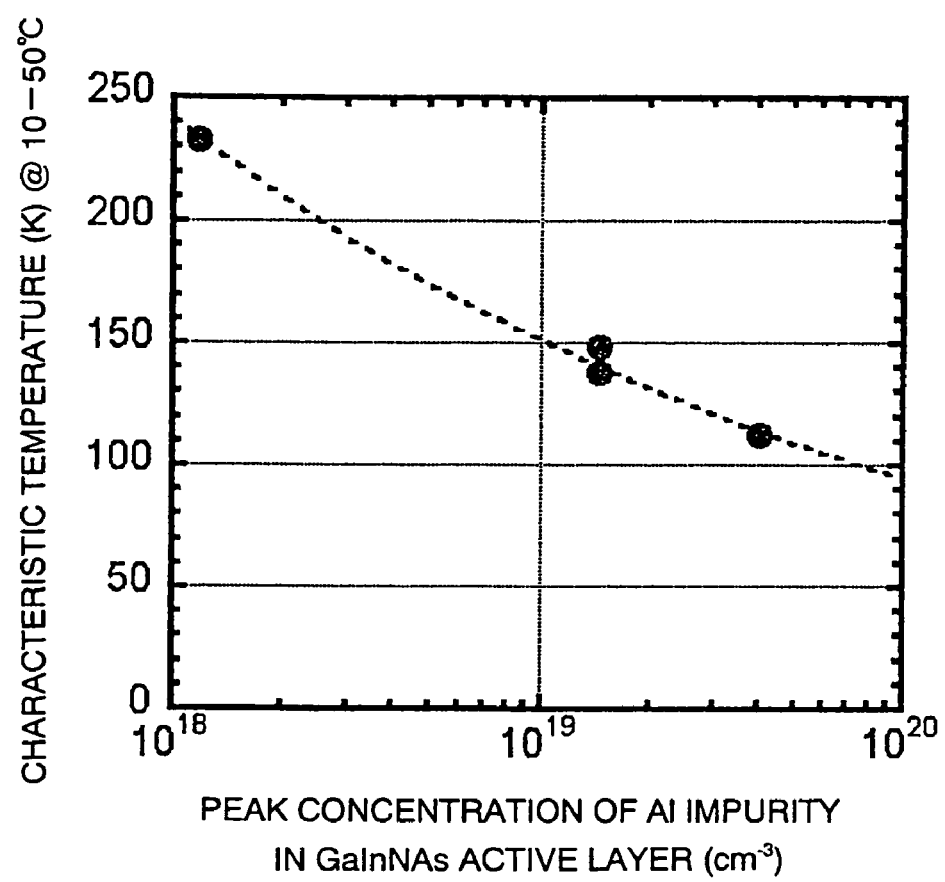
FIG. 2 is a schematic diagram showing correlation between the peak concentration of Al impurity in the GaIn-NAs active layer and the characteristic temperature.
Figure 3:
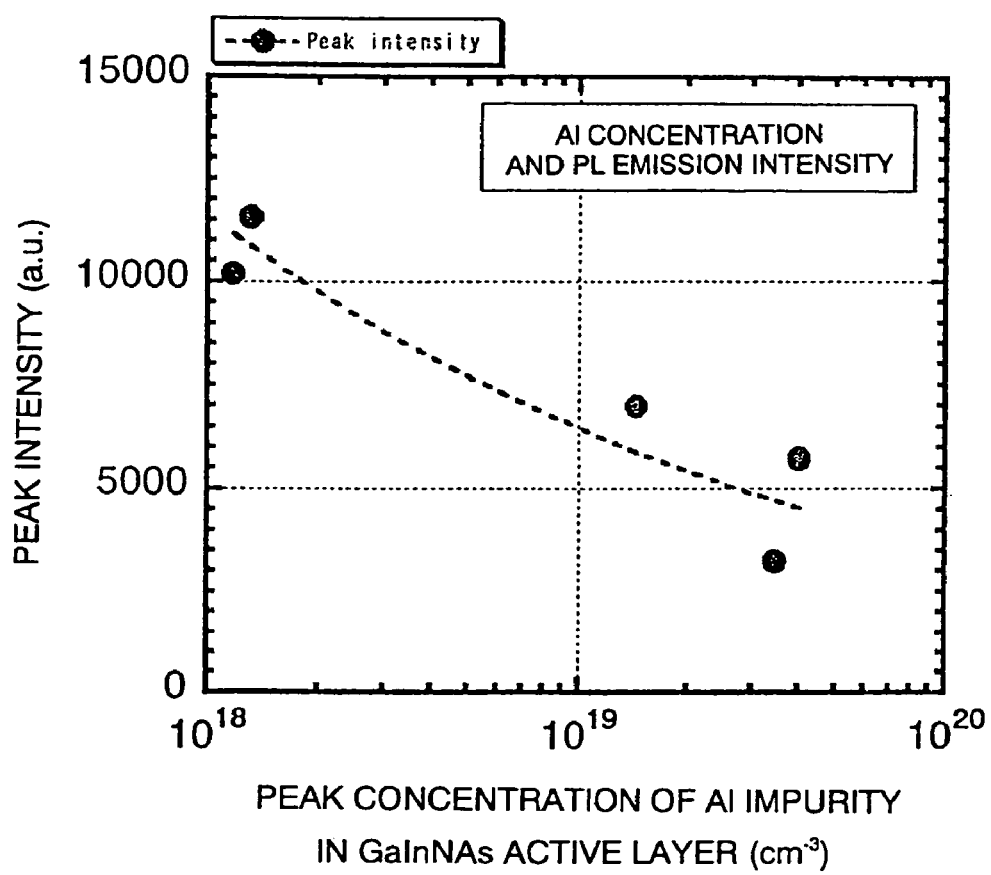
FIG. 3 is a schematic diagram showing correlation between the peak concentration of Al impurity in the GaIn-NAs active layer and the peak intensity of emission spectrum.

Some embodiments of the present invention will now be explained below with reference to the drawings. In all figures showing embodiments of the invention, identical or equivalent portions are labeled with common reference numerals.

Figure 4:
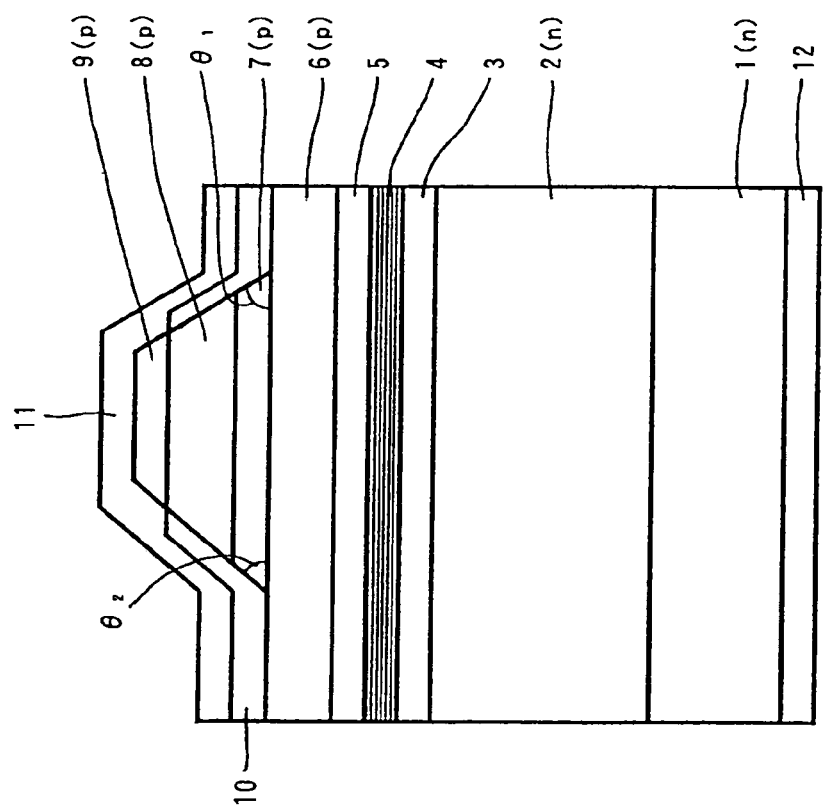
FIG. 4 is a cross-sectional view of a GaInNAs long-wavelength semiconductor laser according to the first embodiment of the invention.

First explained is a GaInNAs long-wavelength semiconductor laser according to the first embodiment of the invention. The GaInNAs long-wavelength semiconductor laser shown here has a SCH (Separate Confinement Heterostructure) structure and a ridge structure. FIG. 4 shows this GaInNAs long-wavelength semiconductor laser.

As shown in FIG. 4, in the GaInNAs long-wavelength semiconductor laser, an n-type clad layer 2, undoped or n-type GaAs optical guide layer 3, active layer 4, undoped or p-type GaAs optical guide layer 5, first p-type clad layer 6, p-type GaAs stop layer 7, second p-type clad layer 8 and p-type GaAs contact layer 9 are sequentially stacked on an n-type GaAs substrate 1 having a major surface inclining by 10° from the (100) plane toward the [110] direction, for example.

Figure 5:
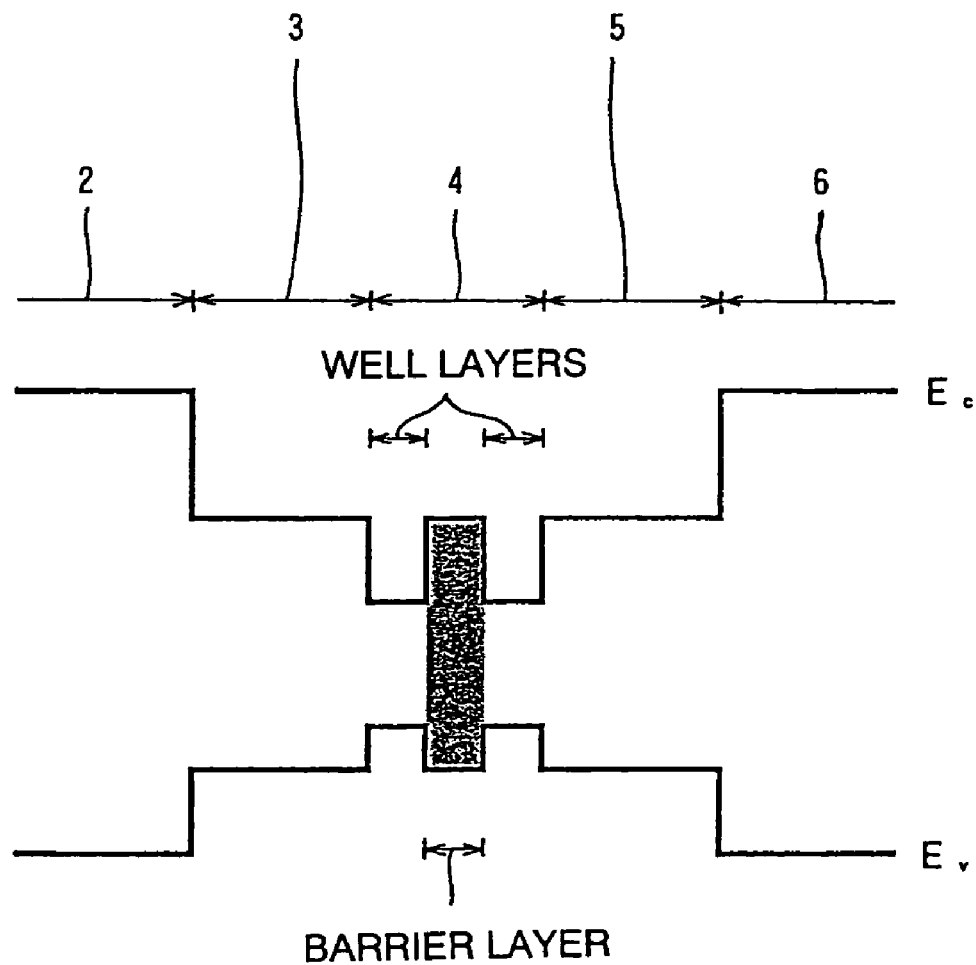
FIG. 5 is a schematic diagram showing the energy band structure of the substantial part of the GaInNAs long-wavelength semiconductor laser according to the first embodiment of the invention.

The n-type clad layer 2 has a structure sequentially depositing an n-type AlGaAs layer (for example, approximately 1 μm thick n-type $Al_{0.30}Ga_{0.70}As$ layer) having the diffraction index of n3, for example, an n-type GaAs layer (approximately 100 nm thick, for example) having the diffraction index of n2 and an n-type AlGaAs layer (for example, approximately 200 nm thick n-type $Al_{0.47}Ga_{0.53}As$ layer) having the diffraction index of n1. The GaAs optical guide layer 3 is approximately 100 nm thick. The active layer 4 has a multi-quantum-well (MQW) structure including $Ga_{1-x}In_xN_yAs_{1-y}$ layers (0<x<1, 0<y<1) as its well layers and $Ga_{1-w}In_wAs$ layers (0<w<x) as its barrier layers, and x and y are determined depending upon the emission wavelength. The active layer 4 is characterized in that the peak concentration of Al impurity in the $Ga_{1-x}In_xN_yAs_{1-y}$ well layers is lower than or equal to $1\times10^{19}$ $cm^{-3}$, or more preferably lower than or equal to $5\times10^{18}$ $cm^{-3}$. FIG. 5 shows an exemplary structure of the active layer 4 including two well layers and a $Ga_{1-w}In_wAs$ layer in which w is zero. In FIG. 5, $E_c$ represents the bottom energy of the conduction band, and $E_v$ is the top energy of the valence band. Thickness of the GaAs optical guide layer 5 is approximately 100 nm for example. The first p-type clad layer has a structure sequentially depositing a p-type AlGaAs layer (for example, approximately 200 nm thick p-type $Al_{0.47}Ga_{0.53}As$ layer) having the diffraction index of n1, for example, an n-type GaAs layer (approximately 100 nm thick, for example) having the diffraction index of n2 and an n-type AlGaAs layer (for example, approximately 1 μm thick n-type $Al_{0.30}Ga_{0.70}As$ layer) having the diffraction index of n3. Thickness of the p-type GaAs stop layer 7 is approximately 200 nm, for example. The second p-type clad layer 8 may be a p-type $Al_{0.30}Ga_{0.70}As$ layer having a thickness around 100 nm for example. Thickness of the p-type GaAs contact layer 9 may be 200 nm approximately.

The p-type GaAs stop layer 7, second p-type clad layer 8 and p-type GaAs contact layer 9 have the form of a stripe extending in the cavity length direction. An insulating layer 10 such as a $SiO_2$ film is formed to cover side surfaces of the stripe portion and the top surface of the first p-type clad layer 6. Since the n-type GaAs substrate 1 is an inclined substrate, if the angles of inclination of opposite side surfaces of the stripe portion are $\theta_1$ and $\theta_2$, then $\theta_1<\theta_2$.

On the p-type GaAs contact layer 9 and the insulating layer 10, a p-side electrode 11 such as a Ti/Pt/Au electrode is formed in ohmic contact with the p-type GaAs contact layer 9. On the bottom surface of the n-type GaAs substrate 1, an n-side electrode such as AuGe/Ni/Au electrode is formed in ohmic contact.

Next explained is a manufacturing method of the GaInNAs long-wavelength semiconductor laser according to the first embodiment.

For manufacturing the GaInNAs long-wavelength semiconductor laser, the n-type clad layer 2, GaAs optical guide layer 3, active layer 4, GaAs optical guide layer 5, first p-type clad layer 6, p-type GaAs stop layer 7, second p-type clad layer 8 and p-type GaAs contact layer 9 are first formed sequentially on the n-type GaAs substrate 1 by MOCVD, for example. During the growth of the GaAs optical guide layer 3 or immediately before the start of growth of the active layer 4, DMHy as a highly reactive gas is supplied together with the source material of As, such as $AsH_3$ or TBAs, while the supply of the source material of the group III element is interrupted such that the DMHy cleans surfaces of the reaction vessel by its etching function and removes extraneous matter such as Al and products of vapor phase reaction including Al. Therefore, the captured amount of Al during the growth of the active layer 4 is reduced significantly, and the peak concentration of Al impurity in the active layer 4 can be reduced sufficiently low, namely, to or below $1\times10^{19}$ $cm^{-3}$. Furthermore, for the same purpose, DMHy is supplied together with the source material of As, such as $As_3$ or TBAs, also during the growth of the GaAs optical guide layer 5 or immediately after the growth of the active layer 4, while the supply of the source material of the group III element is interrupted. In both occurrences, conditions for supplying DMHy may be chosen to introduce it at the flow rate of 270 sccm for 12 minutes, or at 380 sccm for 7 minutes, for example.

After that, a $SiO_2$ film or $Si_3N_4$ film is formed on the entire surface of the p-type GaAs contact layer 9 by chemical vapor deposition (CVD), for example, and it is next patterned to a stripe-shaped mask (not shown) of a predetermined width by etching. Next using the mask, layers to the p-type GaAs stop layer 7 are partly removed by wet etching. As a result, the p-type GaAs atop layer 7, second p-type clad layer 8 and p-type GaAs contact layer 9 are patterned to a stripe extending in one direction.

Subsequently, after the mask used for the above etching is removed, the insulating layer 10 such as $SiO_2$ film is formed on the entire surface by CVD, for example. Thereafter, a resist pattern of a predetermined geometry (not shown) is formed on the insulating layer 10 by lithography. Next using the resist pattern as a mask, the insulating layer 10 is partly removed by etching to expose the p-type GaAs contact layer 9 on the stripe portion.

Thereafter, the p-side electrode 11 is formed on the entire surface of the p-type GaAs contact layer 9 and the insulating layer by vacuum evaporation or sputtering, for example, and the n-side electrode 12 is formed on the bottom surface of the n-type GaAs substrate 1.

After that, the n-type GaAs substrate 1, having the laser structure formed thereon as explained heretofore, is divided and processed into bars by cleavage to expose cavity edges, and an edge coating is formed on these cavity edges. These bars are next divided to chips by cleavage.

Through the steps explained above, the intended GaInNAs long-wavelength semiconductor laser having the SCH structure and the ridge structure is completed.

As explained above, the first embodiment can improve the quality of the active layer 4 by reducing the peak concentration of Al impurity in the active layer 4 as low as $1\times10^{19}$ $cm^{-3}$ or even lower. Therefore, it is possible to manufacture GaInNAs long-wavelength semiconductor lasers enhanced in slope efficiency to 0.25 or higher, for example, enhanced in characteristic temperature to 10 K or even higher, for example, sufficiently enhanced in emission intensity and elongated in lifetime. Moreover, since the embodiment of the invention needs only one step of crystal growth of the GaInNAs long-wavelength semiconductor laser without an additional step of growth after interruption required in the technique proposed by Non-patent Literature 1, the embodiment can reduce the manufacturing cost lower.

Figure 6:
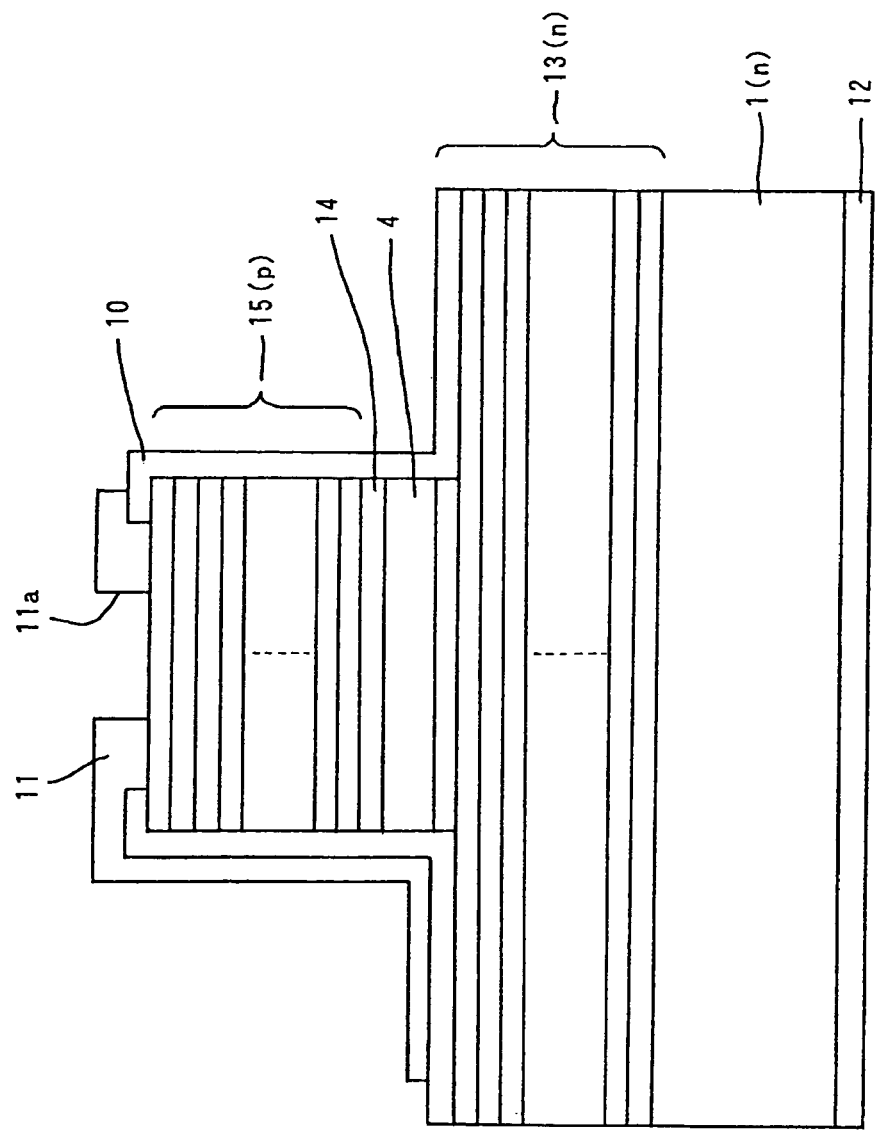
FIG. 6 is a cross-sectional view of a GaInNAs long-wavelength semiconductor laser according to the second embodiment of the invention.

Next explained is a GaInNAs long-wavelength semiconductor laser according to the second embodiment of the invention. The GaInNAs long-wavelength semiconductor laser shown here is of the VCSEL type. FIG. 6 illustrates this GaInNAs long-wavelength semiconductor laser.

As shown in FIG. 6, the GaInNAs long-wavelength semiconductor laser includes an n-type DBR layer 13 in form of a semiconductor multilayered film, an active layer 4 having a $Ga_{1-x}In_xN_yAs_{1-y}/Ga_{1-z}In_zAs$ MQW structure, an AlAs oxide layer 14 and a p-type DBR layer 15 in form of a semiconductor multi-layered film 15, which all are stacked sequentially on a (100)-oriented n-type GaAs substrate 1, for example. The n-type DBR layer 13 and the p-type DBR layer 15 are each made of multiple AlGaAs layers different in Al composition, for example. More specifically, they are made by alternately stacking $Al_{0.1}Ga_{0.9}As$ layers and $Al_{0.9}Ga_{0.1}As$ layers, each having the thickness of $\lambda/4$ ($\lambda$ is the wavelength of light in the medium), by 12 to 22 cycles. The uppermost portion of the n-type DBR layer 13, active layer 4, AlAs oxide layer 14 and p-type DBR layer 15 are shaped in a cylindrical form, for example. The border of the top surface of the cylindrical portion, side surface of the cylindrical portion and the top surface of the n-type DBR layer 13 are covered by a $SiO_2$ insulating layer 10. A p-side electrode 11 is formed to extend over the insulating film 10 from the top surface of the cylindrical portion, and it is in ohmic contact with the p-type DBR layer 15. The p-side electrode 11 has formed a light take-out opening 11a above the center of the top surface of the cylindrical portion. An n-side electrode 12 is in ohmic contact with the bottom surface of the n-type GaAs substrate 1.

Next explained is a manufacturing method of the GaInNAs long-wavelength semiconductor laser according to the second embodiment.

To manufacture the GaInNAs long-wavelength semiconductor laser, the n-type DBR layer 13, active layer 4, AlAs oxide layer 14 and p-type DBR layer 15 are first grown sequentially on the n-type GaAs substrate 1. Similarly to the first embodiment, immediately before starting the growth of the active layer 4, the supply of the source material of the group III element is interrupted. In this condition, DMHy is supplied together with a source material of As, such as $AsH_3$ or TBAs. Additionally, immediately after the growth of the active layer 4, the source material of the group III element is interrupted, and DMHy is supplied together with the source material of As like $AsH_3$ or TBAs. Conditions for the supply of DMHy may be identical to the conditions of the first embodiment.

After that, a resist pattern (not shown) of a predetermined geometry is formed on the p-type DBR layer 15, and using the resist pattern as a mask, layers to the uppermost portion of the n-type DBR layer 13 are partly removed by etching to shape them in a cylindrical form.

After that, the insulating layer 10 is formed on the entire substrate surface. A resist pattern (not shown) of a predetermined geometry is next formed on the insulating layer 10, and using the resist pattern as a mask, the insulating layer 10 is partly removed by etching to expose the central top surface of the cylindrical portion. Thereafter, the p-side electrode is formed on the entire substrate surface, and a resist pattern (not shown) of a predetermined geometry is next formed on the p-side electrode 11. Using this resist pattern as a mask, the p-side electrode 11 is partly removed by etching to form the light take-out opening 11a. Thereafter, the n-side electrode 12 is formed on the bottom surface of the n-type GaAs substrate 1.

Thereafter, the n-type GaAs substrate 1 having formed the laser structure thereon is divided to chips by cleavage, for example.

Through those steps, the intended VCSEL type GaInNAs long-wavelength semiconductor laser is completed.

The second embodiment ensures the same advantages as those of the first embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, materials, configurations and processes specifically shown in the explanation of the embodiments are not but examples, and any other appropriate numerical values, materials, configurations and processes may be used, where necessary.

For example, MOCVD used for growth of semiconductors in the first and second embodiments may be replaced by molecular beam epitaxy (MBE) or other appropriate technique.

What is claimed is:

1. A manufacturing method of a long-wavelength semiconductor light emitting device using $Ga_{1-x}In_xN_yAs_{1-y-z}Sb_z$ ($0<x<1$, $0<y<1$, $0\leq z<1$) as an active layer thereof and having a peak concentration of Al impurity contained in the active layer, which is controlled to be lower than or equal to $1\times10^{19}$ $cm^{-3}$, comprising:
    supplying a highly reactive gas together with a source material of As while the supply of a source material of a group III element is interrupted during the growth of a layer anteriorly adjacent to the active layer or immediately before the growth of the active layer.

2. The manufacturing method of a long-wavelength semiconductor light emitting device according to claim 1 wherein the highly reactive gas is di-methyl hydrazine, ammonia or nitrogen radicals.

3. The manufacturing method of a long-wavelength semiconductor light emitting device according to claim 1 wherein the source material of As is arsine or tertiary-butyl arsine.

4. The manufacturing method of a long-wavelength semiconductor light emitting device according to claim 1 wherein the layer anteriorly adjacent to the active layer is an optical guide layer.

5. The manufacturing method of a long-wavelength semiconductor light emitting device according to claim 1 wherein the peak concentration of the Al impurity contained in the active layer is lower than or equal to $5\times10^{18}$ $cm^{-3}$.

* * * * *